(12) United States Patent
Chang (10) Patent No.: US 8,653,858 B2
(45) Date of Patent: Feb. 18, 2014

(54) SIGNAL OPERATING CIRCUIT (75) Inventor: Hui-Ju Chang, Kaohsiung (TW)

(73) Assignee: Silicon Motion Inc., Jhubei, Hsinchu County (TW)

( * ) Notice: Subject to any disclaimer, the term of this patent is extended or adjusted under 35 U.S.C. 154(b) by 12 days.

(21) Appl. No.: 13/426,616

(22) Filed: Mar. 22, 2012

(65) Prior Publication Data

US 2013/0009670 A1   Jan. 10, 2013

(30) Foreign Application Priority Data

Jul. 8, 2011 (TW) .............................. 100124290 A (51) Int. Cl.
 *H03F 3/45* (2006.01)
(52) U.S. Cl.
 USPC .................................. 327/55; 327/52; 327/57
(58) Field of Classification Search
 None
 See application file for complete search history.

(56) References Cited

U.S. PATENT DOCUMENTS

| | | | | |
|---|---|---|---|---|
| 5,510,734 A * | 4/1996 | Sone | ............................... | 327/65 |
| 6,861,888 B2 * | 3/2005 | Hsieh | ............................ | 327/208 |
| 7,400,183 B1 * | 7/2008 | Sivadasan et al. | ............ | 327/261 |

* cited by examiner

*Primary Examiner* — An Luu
(74) *Attorney, Agent, or Firm* — Winston Hsu; Scott Margo (57) ABSTRACT A signal operating circuit includes: a loading device, having a loading value, wherein the loading value is deviated from a predetermined loading value by a loading deviation value; an input stage coupled to the loading device, for converting an input signal into an output signal according to a controlling signal; a latching stage coupled to the loading device and the input stage for latching the output signal according to the controlling signal; and a controlling circuit coupled to the latching stage for adjusting an operating current flowing through the latching stage and an operating current flowing through the input stage to compensate the loading deviation value according to the loading deviation value of the loading device.

12 Claims, 7 Drawing Sheets

SIGNAL OPERATING CIRCUIT

BACKGROUND OF THE INVENTION

1. Field of the Invention

The present invention relates to a low cost flip-flop circuit, and more particularly to a ring oscillator and a phase-locked loop circuit implemented by the low cost flip-flop circuit.

2. Description of the Prior Art

In a conventional N-stage ring oscillator, the delay unit in each stage provides a predetermined delay amount. The delay amount may determine an oscillating frequency of the N-stage ring oscillator. More specifically, the delay amount of the delay unit in each stage depends on an output resistor of the delay unit; however, the resistance of the output resistor may deviate from the desired value due to process variations of the semiconductor manufacturing process. The oscillating frequency of the N-stage ring oscillator may then drift from a desired frequency. In addition, when the N-stage ring oscillator is applied in a phase-locked loop, the characteristic curve of the gain (Kvco) of the N-stage voltage-controlled ring oscillator may also deviate from the desired characteristic curve due to the resistance deviation. To correct for this, the oscillating frequency of the N-stage oscillator should be adjusted to the original-designed frequency after the N-stage oscillator is fabricated, by making the slope of the gain of the voltage-controlled oscillator steeper than the original slope. This allows the oscillating frequency to be adjusted by the input voltage of the voltage-controlled oscillator so it can be calibrated back to the desired frequency band. In order to do this, however, the gain of the voltage-controlled oscillator must be very large, which means the N-stage oscillator becomes very sensitive for the input signal. Moreover, when the gain of the voltage-controlled oscillator is very large, the size (capacitance) of a capacitor of a low-pass filter in the phase-locked loop must also be very large in order to filter out the high frequency signals of the phase-locked loop. Accordingly, the cost of the phase-locked loop is increased. Therefore, how to improve the effects caused by the deviation of the resistor in a delay unit of an N-stage ring oscillator is an urgent problem in this field.

SUMMARY OF THE INVENTION

One of the objectives of the present invention is to provide a ring oscillator and a phase-locked loop circuit implemented by a low cost flip-flop circuit.

According to an embodiment of the present invention, a signal operating circuit is disclosed. The signal operating circuit comprises a loading device, an input stage, a latching stage, and a controlling circuit. The input stage is coupled to the loading device for converting an output signal into an input signal according to a controlling signal. The latching stage is coupled to the loading device and the input stage, for latching the output signal according to the controlling signal. The controlling circuit is coupled to the latching stage, for at least adjusting an operating current of the latching stage to compensate a loading deviation value according to the loading deviation value of the loading device.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
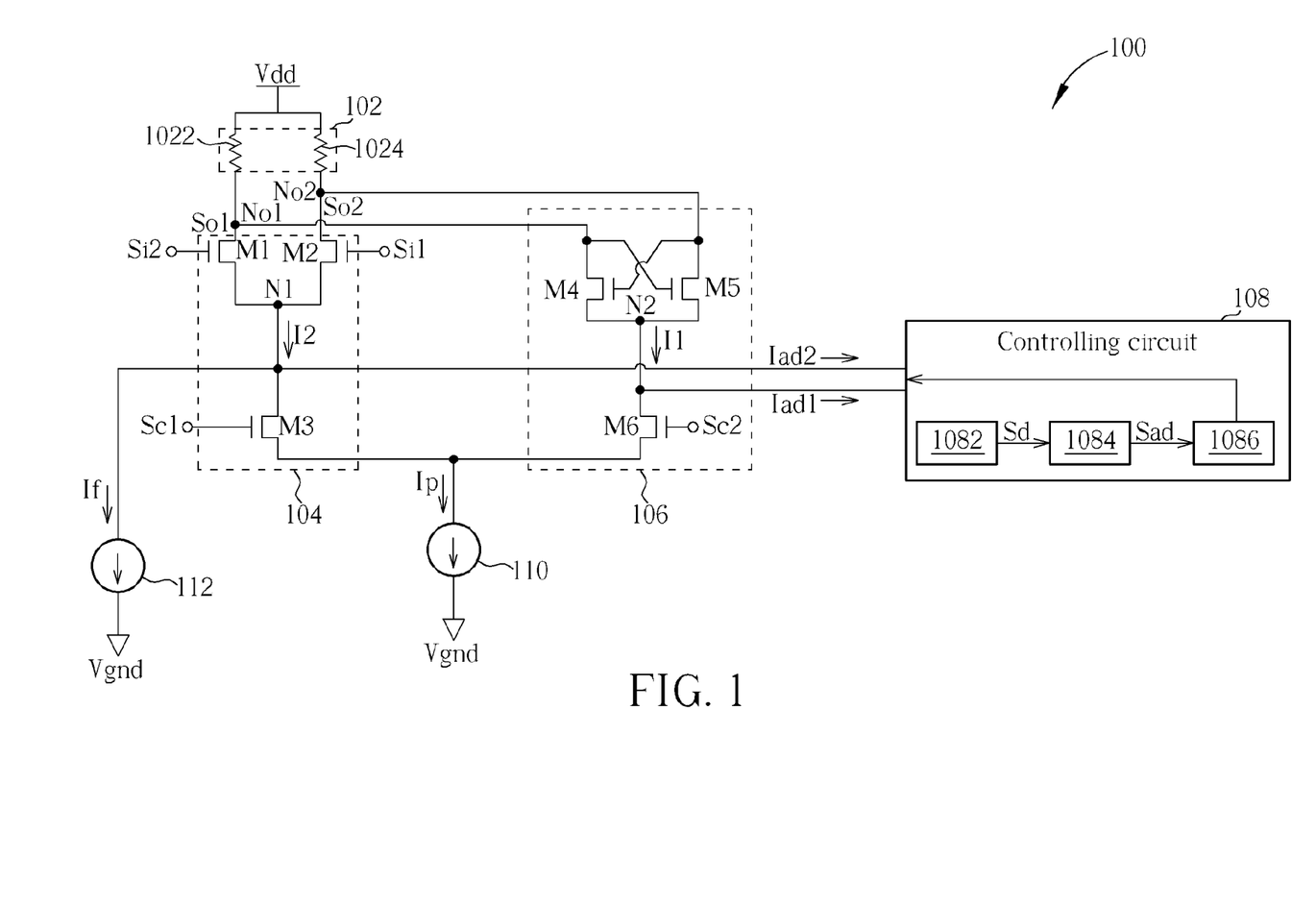
FIG. 1 is a diagram illustrating a signal operating circuit according to an embodiment of the present invention.

Please refer to FIG. 1, which is a diagram illustrating a signal operating circuit 100 according to an embodiment of the present invention. The signal operating circuit 100 comprises a loading device 102, an input stage 104, a latching stage 106, and a controlling circuit 108. The signal operating circuit 100 is a differential controlling circuit, and the signal operating circuit 100 is operated between a supply voltage Vdd and a ground voltage Vgnd. The loading device 102 comprises a first resistor 1022 and a second resistor 1024. In this embodiment, the resistance of the first resistor 1022 substantially equals the resistance of the second resistor 1024. The input stage 104 is coupled to the loading device 102 for converting an input signal Si1, Si2 into an output signal So1, So2 according to a first controlling signal Sc1, and outputting the output signal So1, So2 at the output terminal No1, No2 respectively. The latching stage 106 is coupled to the loading device 102 and the input stage 104, and arranged to latch the output signal So1, So2 according to a second controlling signal Sc2. Please note that, in this embodiment, the first controlling signal Sc1 and the second controlling signal Sc2 are configured into a differential clock controlling signal, and the input signal Si1, Si2 and the output signal So1, So2 are differential signals. The input stage 104 comprises a differential input pair M1, M2 and a controlling field effect transistor M3, wherein the controlling field effect transistor M3 is coupled between a common node N1 of the differential input pair M1, M2 and a reference current source 110, and is controlled by the first controlling signal Sc1, and the differential input pair M1, M2 and the controlling field effect transistor M3 are N type field effect transistors. Furthermore, the latching stage 106 comprises a cross-coupled pair M4, M5 and a controlling field effect transistor M6, wherein the controlling field effect transistor M6 is coupled between a common node N2 of the cross-coupled pair M4, M5 and the reference current source 110, and is controlled by the second controlling signal Sc2, and the cross-coupled pair M4, M5 and the controlling field effect transistor M6 are N type field effect transistors. The reference current source 110 is coupled to a common node of the controlling field effect transistors M5, M6 and the ground voltage Vgnd, and the reference current source 110 is arranged to provide a reference current Ip. Furthermore, this embodiment further comprises a reference current source 112, which is coupled between the common node N1 and the ground voltage Vgnd, and is arranged to provide another reference current If.

In this embodiment, the first resistor 1022 and the second resistor 1024 in the loading device 102 may be affected by the semiconductor manufacturing process. More specifically, the resistances of the first resistor 1022 and the second resistor 1024 may deviate from the desired values due to the semiconductor manufacturing process. Therefore, the present controlling circuit 108 is arranged to couple to the input stage 104 and the latching stage 106 for adjusting an operating current I1 flowing through the latching stage 106 according to a loading deviation value of the loading device 102 in order to compensate the loading deviation value, and also to adjust an operating current I2 of the input stage 104 at the same time. Please note that, in this embodiment, the loading deviation value is the resistance deviation value of the first resistor 1022 and the second resistor 1024. The controlling circuit 108 comprises a detecting circuit 1082, a signal amplifying circuit 1084, and an adjusting circuit 1086. The detecting circuit 1082 is utilized to generate a detecting signal Sd corresponding to the loading deviation value. The signal amplifying circuit 1084 is coupled to the detecting circuit 1082 and the adjusting circuit 1086, and arranged to perform a signal amplifying operation upon the detecting signal Sd to generate an adjusting signal Sad. Please note that the signal amplifying circuit 1084 may be omitted in another embodiment. The adjusting circuit 1086 is coupled to the detecting circuit 1084 for adjusting the operating current I1 and the operating current I2 flowing through the latching stage106 and the input stage 104, respectively, according to the detecting signal Sd, which means that the adjusting circuit 1086 uses the adjusting signal Sad to adjust the operating current I1 and the operating current I2.

Figure 2:
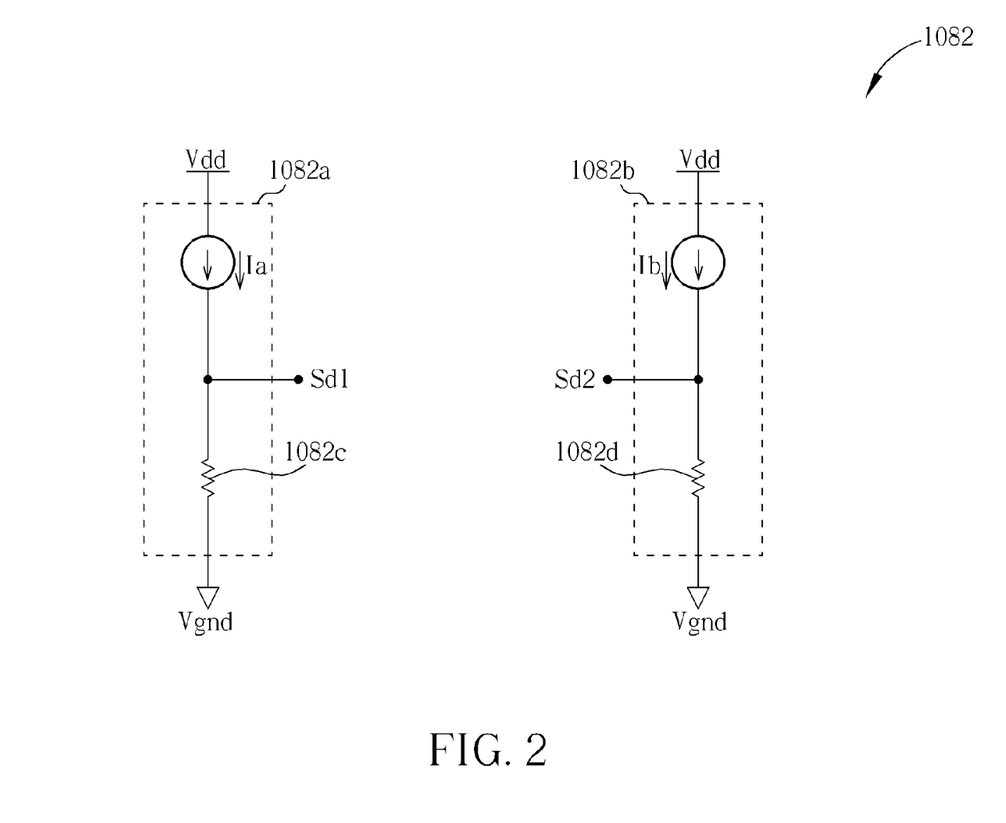
FIG. 2 is a diagram illustrating a detecting circuit according to an embodiment of the present invention.

Please refer to FIG. 2, which is a diagram illustrating a detecting circuit 1082 according to an embodiment of the present invention. The detecting circuit 1082 comprises a first voltage signal generating circuit 1082a and a second voltage signal generating circuit 1082b. The first voltage signal generating circuit 1082a is utilized to output a first current Ia upon a first resistor 1082c to generate a first voltage signal Sd1 of the detecting signal Sd, and the second voltage signal generating circuit 1082b is utilized to output a second current Ib upon a second resistor 1082d to generate a second voltage signal Sd2 of the detecting signal Sd, wherein both the resistance deviation value of the first resistor 1082c and the resistance deviation value of the second resistor 1082d are similar to the resistance deviation value of the loading resistor 102, which means that the first resistor 1082c, the second resistor 1082d, and the loading resistor 102 are fabricated on the same wafer. Furthermore, the first current Ia corresponds to the resistance deviation value of the loading resistor 102, which means that the degree of current deviation of the first current Ia affected by the fabricating process is substantially equal to the degree of resistance deviation of the loading resistor 102. The second current Ib is a fixed predetermined current which is not affected by the fabricating process. In other words, when the signal operating circuit 100 is fabricated by a semiconductor manufacturing process, the positions of the first resistor 1082c, the second resistor 1082d, the first resistor 1022, and the second resistor 1024 are adjacent to each other such that the first resistor 1082c, the second resistor 1082d, the first resistor 1022, and the second resistor 1024 may have substantially the same resistance deviation values. In this embodiment, both the resistance deviation value of the first resistor 1082c and the resistance deviation value of the second resistor 1082d are substantially equal to the resistance deviation value of the loading resistor 102, the amount of the first current Ia corresponds to the resistance deviation value of the loading resistor 102, and the second current Ib is a predetermined current (e.g. a fixed current), meaning the first voltage signal Sd1 can be a predetermined voltage, and the deviation value of the second voltage signal Sd2 can be directly proportional to the resistance deviation value of the loading resistor 102 after appropriate modifications are made to the signal operating circuit 100. In other words, the resistance deviation value of the loading resistor 102 corresponds to the difference value between the first voltage signal Sd1 and the second voltage signal Sd2.

Figure 3:
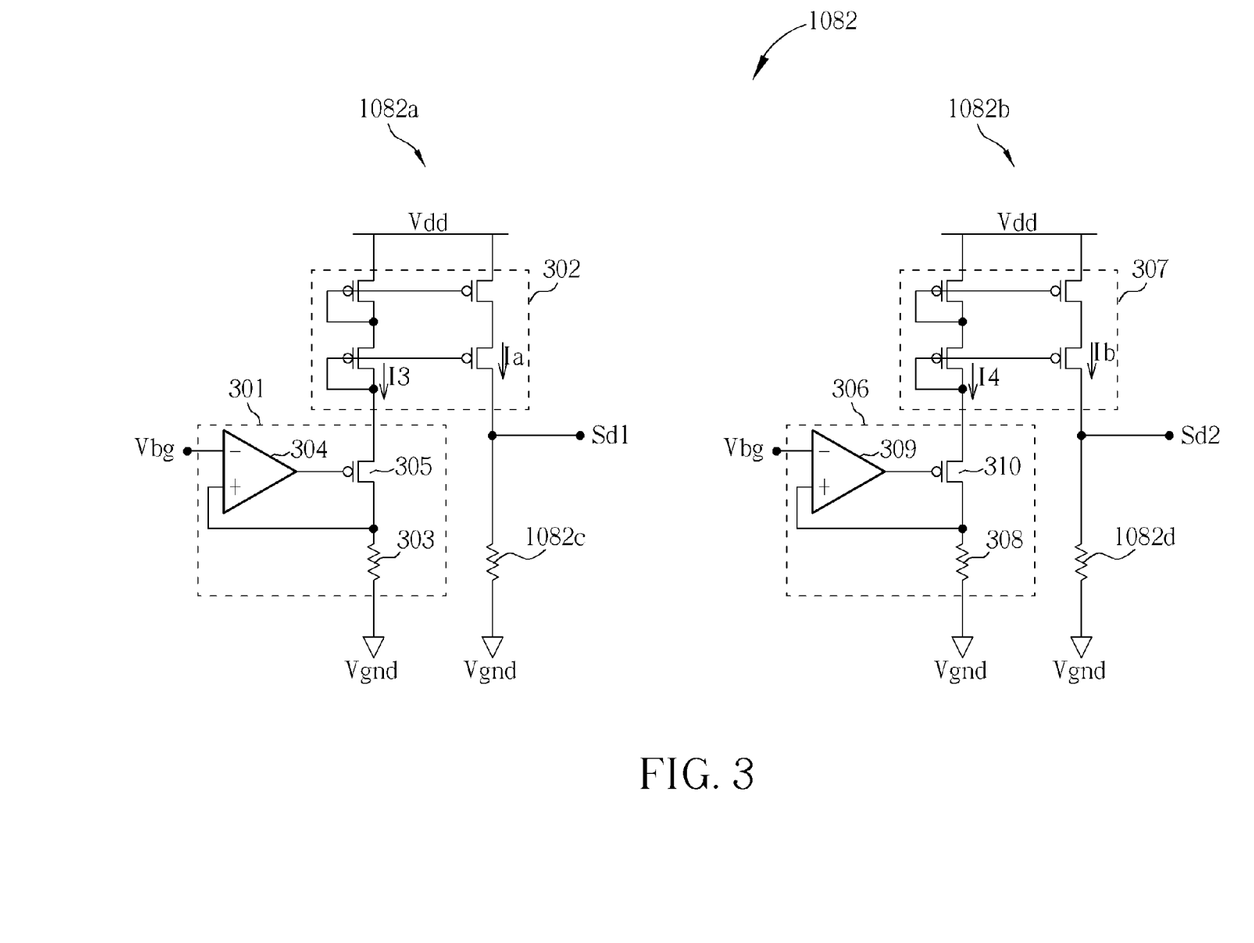
FIG. 3 is a detailed diagram illustrating a detecting circuit according to an embodiment of the present invention.

Please refer to FIG. 3, which is a detailed diagram illustrating a detecting circuit 1082 according to an embodiment of the present invention. The first voltage signal generating circuit 1082a comprises a transconducting circuit 301, a current mirror 302, and a first resistor 1082c. The transconducting circuit 301 is utilized to generate a predetermined voltage Vbg upon a third resistor 303 to generate a current I3. The current mirror 302 is coupled to the transconducting circuit 301 for generating the first current Ia according to the current I3. The first resistor 1082c is coupled to the current mirror 302 for receiving the first current Ia to generate the first voltage signal Sd1, wherein the resistance deviation value of the third resistor 303 is substantially equal to the resistance deviation value of the loading resistor 102. In other words, when the signal operating circuit 100 is fabricated by the semiconductor manufacturing process, the position of the third resistor 303 is adjacent to or close to the positions of the first resistor 1082c, the second resistor 1082d, the first resistor 1022, and the second resistor 1024 such that the third resistor 303, the first resistor 1082c, the second resistor 1082d, the first resistor 1022, and the second resistor 1024 have the same resistance deviation values. The transconducting circuit 301 further comprises an amplifier 304 and a field effect transistor 305. The output terminal of the amplifier 304 is coupled to the gate terminal of the field effect transistor 305, a negative input terminal (−) is utilized to receive the predetermined voltage Vbg, and a positive output terminal (+) is coupled to the third resistor 303. In this embodiment, the field effect transistor 305 is a P type field effect transistor. Accordingly, the transconducting circuit 301 can be used to generate the corresponding current I3 according to the resistance deviation value of the third resistor 303.

The second voltage signal generating circuit 1082b comprises a transconducting circuit 306, a current mirror 307, and the second resistor 1082d. The transconducting circuit 306 is used to output the predetermined voltage Vbg to a reference resistor 308 for generating a current I4. The current mirror 307 is coupled to the transconducting circuit 306, and is utilized to generate the second current Ib according to the current I4. The second resistor 1082d is coupled to the current mirror 307, and is utilized to receive the second current Ib for generating the second voltage signal Sd2, wherein the reference resistor 308 has a predetermined reference resistance. In this embodiment, the reference resistor 308 is an external resistor, which means that the reference resistor 308 is externally coupled to the other circuits of the signal operating circuit 100. The transconducting circuit 306 further comprises an amplifier 309 and a field effect transistor 310. The output terminal of the amplifier 309 is coupled to the gate terminal of the field effect transistor 310, a negative input terminal (−) is utilized to receive the predetermined voltage Vbg, and a positive input terminal (+) is coupled to the reference resistor 308. In this embodiment, the field effect transistor 310 is a P type field effect transistor. Accordingly, the transconducting circuit 306 can be used to generate a predetermined current I4. Please note that the detailed connectivity of the above circuit is shown in FIG. 3, and the detailed description is therefore omitted here for brevity.

Figure 4:
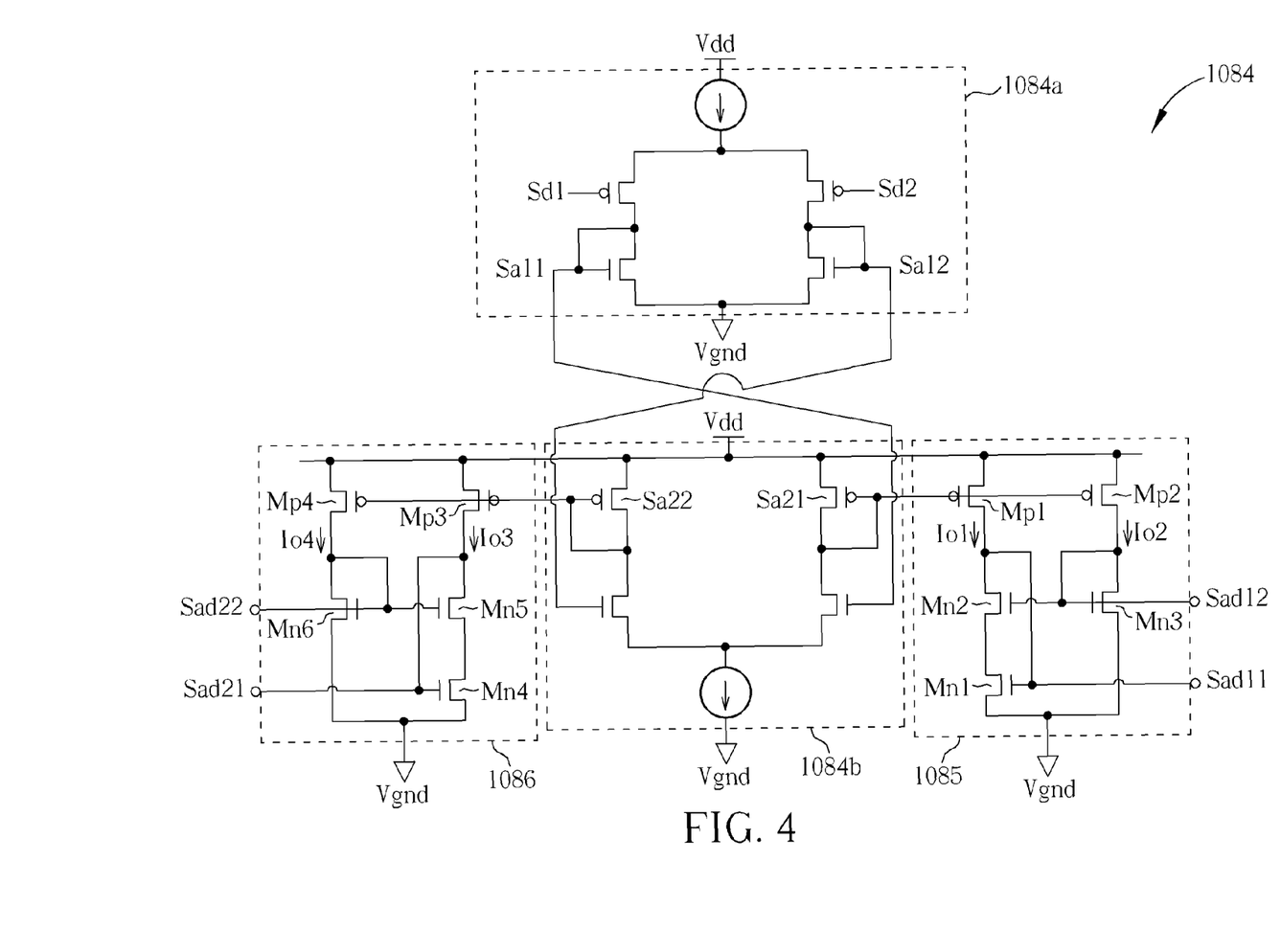
FIG. 4 is a detailed diagram illustrating a signal amplifying circuit according to an embodiment of the present invention.

Please refer to FIG. 4, which is a detailed diagram illustrating a signal amplifying circuit 1084 according to an embodiment of the present invention. The signal amplifying circuit 1084 comprises an input-stage amplifying circuit 1084a, an intermediate amplifying circuit 1084b, and an output-stage amplifying circuit 1084c. The input-stage amplifying circuit 1084a is used to provide a first gain upon the detecting signal Sd (i.e. Sd1, Sd2) to generate a first amplifying signal Sa1, wherein the DC (Direct Current) bias voltage of the first amplifying signal Sa1 is different from the DC bias voltage of the detecting signal Sd. The intermediate amplifying circuit 1084b is coupled to the input-stage amplifying circuit 1084a for providing a second gain upon the first amplifying signal Sa1 to generate a second amplifying signal Sa2, wherein the DC bias voltage of the second amplifying signal Sa2 is different from the DC bias voltage of the first amplifying signal Sa1. The output-stage amplifying circuit 1084c is coupled to the intermediate amplifying circuit 1084b for providing a third gain upon the second amplifying signal Sa2 to generate the adjusting signal Sad.

According to FIG. 4, the input-stage amplifying circuit 1084a is a differential amplifier, which uses a P type transistor pair to receive the differential detecting signal Sd (i.e. Sd1, Sd2), and the P type differential transistor pair is cascoded to a differential diode-connected N type transistor pair for outputting the first amplifying signal Sa1. The first amplifying signal Sa1 is a differential output signal, which comprises the signals Sa11 and Sa12. In addition, the DC bias voltage of the first amplifying signal Sa1 is lower than the DC bias voltage of the detecting signal Sd. The intermediate amplifying circuit 1084b is also a differential amplifier, which uses an N type differential transistor pair to receive the differential first amplifying signal Sa1 (i.e. Sa11, Sa12), and the N type differential transistor pair is cascoded to a differential diode-connected P type transistor pair for outputting the second amplifying signal Sa2. The second amplifying signal Sa2 is a differential output signal, which comprises the signals Sa21 and Sa22. The DC bias voltage of the second amplifying signal Sa2 is higher than the DC bias voltage of the first amplifying signal Sa1.

The output-stage amplifying circuit 1084c comprises two outputting circuits 1085, 1086, wherein the outputting circuit 1085 is used to convert the signal Sa21 in the second amplifying signal Sa2 into two adjusting signals Sad11, Sad12 having different respective DC bias voltages, and the outputting circuit 1086 is used to convert the signal Sa22 in the second amplifying signal Sa2 into two adjusting signals Sad21, Sad22 having different respective DC bias voltages, wherein the DC bias voltages of the adjusting signal Sad12, Sad22 are higher than the DC bias voltages of the adjusting signal Sad11, Sad21. More specifically, each of the outputting circuits uses two P type transistors (i.e. Mp1 and Mp2 in the outputting circuit 1085, and Mp3 and Mp4 in the outputting circuit 1086) to convert the second amplifying signal Sa2 into two output currents (i.e. Io1, Io2 in the outputting circuit 1085, and Io3, Io4 in the outputting circuit 1086). Then, a diode-connected N type transistor Mn1 and an N type transistor Mn2 are utilized to convert the output current Io1 into the adjusting signal Sad11, and the N type transistor Mn3 is utilized to convert the output current Io2 into the adjusting signal Sad12. At the same time, a diode-connected N type transistor Mn4 and an N type transistor Mn5 are utilized to convert the output current Io3 into the adjusting signal Sad21, and the N type transistor Mn6 is utilized to convert the output current Io4 into the adjusting signal Sad22. Please note that the detailed connectivity of the above circuit is illustrated in FIG. 4, and the detailed description is therefore omitted here for brevity.

Figure 5:
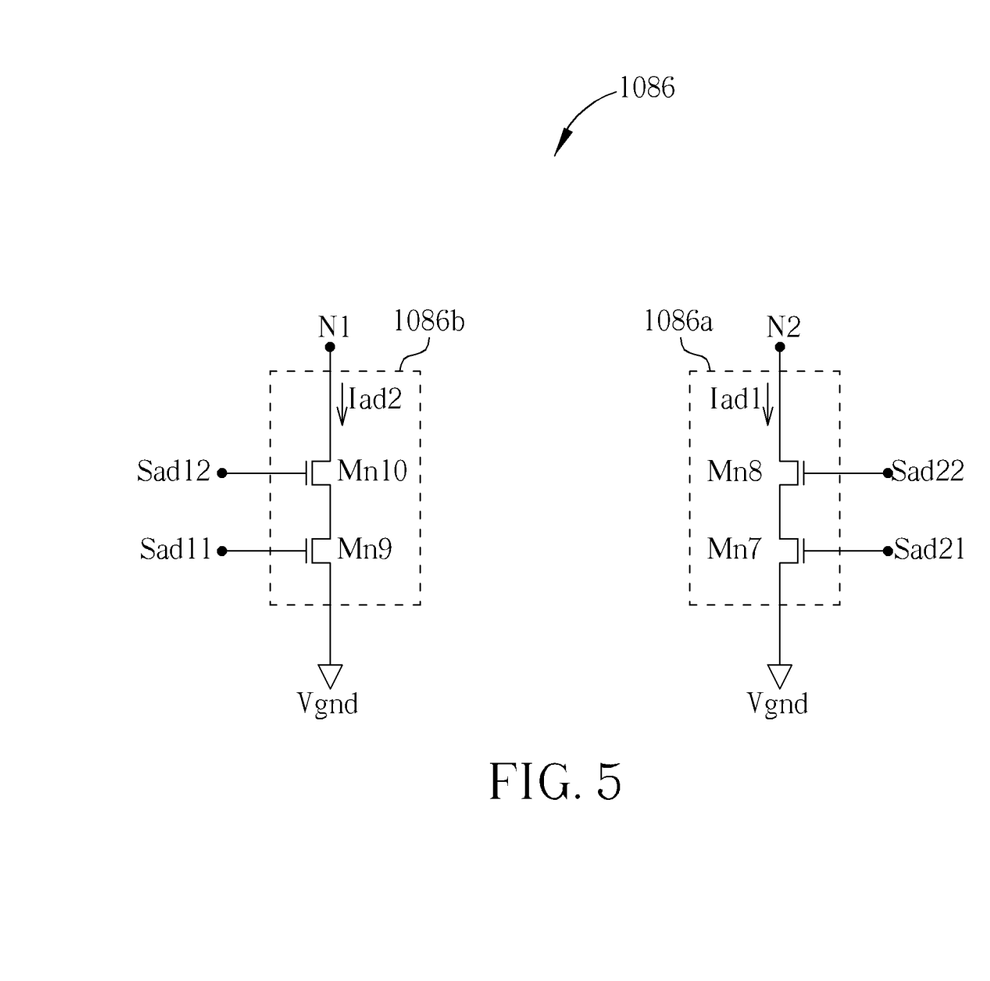
FIG. 5 is a detailed diagram illustrating an adjusting circuit according to an embodiment of the present invention.

Please refer to FIG. 5, which is a detailed diagram illustrating an adjusting circuit 1086 according to an embodiment of the present invention. The adjusting circuit 1086 comprises a first cascoded transconducting circuit 1086a and a second cascoded transconducting circuit 1086b. The first cascoded transconducting circuit 1086a is coupled to the common node N2 of the cross-coupled pair M4, M5 in the latching stage 106 for generating a first adjusting current Iad1 to adjust the operating current I1 of the latching stage 106 according to the signals Sad21, Sad22 of the adjusting signal Sad. The second cascoded transconducting circuit 1086b is coupled to the common node N1 of the cross-coupled pair M1, M2 in the latching stage 104 for generating a second adjusting current Iad2 to adjust the operating current I2 of the input stage 104 according to the signals Sad11, Sad12 of the adjusting signal Sad.

More specifically, the first cascoded transconducting circuit 1086a comprises an N type transistor Mn7 and an N type transistor Mn8, wherein the gate terminals of the N type transistor Mn7 and the N type transistor Mn8 are utilized to receive the signals Sad21 and the signal Sad22. The second cascoded transconducting circuit 1086b comprises an N type transistor Mn9 and an N type transistor Mn10, wherein the gate terminals of the N type transistor Mn9 and the N type transistor Mn10 are utilized to receive the signals Sad11 and the signal Sad12. Please note that the detailed connectivity of the above circuit is illustrated in FIG. 5, and the detailed description is therefore omitted here for brevity.

According to this embodiment, if the output resistance Rout at the output terminals No1, No2 of the signal operating circuit 100 is Rp+(−Rn), wherein the resistance Rp is the predetermined resistance of the loading device 102 seen from the output terminals No1, No2, and the resistance −Rn is the resistance of the latching stage 106 seen from the output terminals No1, No2. More specifically, −Rn=−1/gm, wherein gm is the transconducting gain of the cross-coupled pair M4, M5 corresponding to a predetermined operating current. Normally, the value of gm is directly proportional to the operating current of the cross-coupled pair M4, M5. When the signal operating circuit 100 is fabricated by a semiconductor manufacturing process, however, the resistances of the first resistor 1022 and the second resistor 1024 of the loading device 102 may deviate from the original desired value, which means that, when the signal operating circuit 100 is fabricated by the semiconductor manufacturing process, the resistance of the output terminals No1, No2 seen from the loading device 102 is not the predetermined resistance anymore, and becomes a deviated resistance Rpb. Accordingly, the output resistance of the output terminals No1, No2 becomes Rpb+(−Rn) and not the original desired output resistance Rout (i.e. Rp+(−Rn)). To calibrate the output resistance Rpb+(−Rn) into the original desired output resistance Rout, the controlling circuit 108 is designed to adjust the operating current I1 flowing through the latching stage 106 for adjusting the transconducting gain gm of the cross-coupled pair M4, M5 in order to compensate the loading deviation value according to a loading deviation value corresponding to the loading device 102. Please note that, to ensure that the total operating current of the signal operating circuit 100 can be kept intact after the adjustment of the operating current I1 of the latching stage 106, the present controlling circuit 108 also adjusts the operating current I2 of the input stage 104 at the same time. When the controlling circuit 108 increases the operating current I1 flowing through the latching stage 106 by a current amount, the controlling circuit 108 also decreases the operating current I2 flowing through the input stage 104 by the same current amount. When the controlling circuit 108 decreases the operating current I1 flowing through the latching stage 106 by a current amount, the controlling circuit 108 also increases the operating current I2 flowing through the input stage 104 by the same current amount.

To precisely measure the resistance deviation values of the first resistor 1022 and the second resistor 1024, the present invention also fabricates some resistors adjacent to or near to the first resistor 1022 and the second resistor 1024, i.e. the resistors are the first resistor 1082c, the second resistor 1082d, and the third resistor 303. The first resistor 1082c, the second resistor 1082d, and the third resistor 303 have resistance deviation values substantially equal to the resistance deviation values of the first resistor 1022 and the second resistor 1024. When the signal operating circuit 100 is fabricated by the semiconductor manufacturing process, the first voltage signal generating circuit 1082a in FIG. 3 is then utilized to generate the first current Ia according to a predetermined voltage Vbg generated by a bandgap reference circuit and the third resistor 303. Then, the first current Ia flows through the first resistor 1082c to generate the first voltage signal Sd1. If the first current Ia is equal to the current I3, then the first voltage signal Sd1 is substantially equal to the predetermined voltage Vbg. In other words, the first voltage signal Sd1 is a known voltage signal, and the first voltage signal Sd1 depends on the ratio between the first current Ia and the current I3, and does not depend on the resistance deviation value.

The second voltage signal Sd2 generated by the second voltage signal generating circuit 1082b as shown in FIG. 3 is varied according to the resistance deviation value. More specifically, the reference resistor 308 is a known external resistor, so the second current Ib generated in accordance with the predetermined voltage Vbg and the reference resistor 308 is also a known current. In this embodiment, the known external resistor can be set as the desired resistor of the loading device 102. Then, when the second current Ib flows through the deviated second resistor 1082d, the second voltage signal Sd2 may be used to represent the resistance deviation value. In other words, when the circuit system is a differential circuit system, the difference amount between the first voltage signal Sd1 and the second voltage signal Sd2, and the signs of the first voltage signal Sd1 and the second voltage signal Sd2 can be utilized to deduce the deviated vector and deviated magnitudes of the resistance of the loading device 102. After appropriate modifications, the difference between the first voltage signal Sd1 and the second voltage signal Sd2 can be amplified and then fed back to the latching stage106 for adjusting the operating current I1 flowing through the latching stage106 to compensate the loading deviation value.

In this embodiment, the operating current I1 of the latching stage 106 and the operating current I2 of the input stage 104 are controlled by the first cascoded transconducting circuit 1086a and the second cascoded transconducting circuit 1086b respectively, and each of the cascoded transconducting circuits has two control terminals (the gate terminals of Mn7 and Mn8, and the gate terminals of Mn9 and Mn10), so the signal amplifying circuit 1084 uses the different amount between the first voltage signal Sd1 and the second voltage signal Sd2 to generate the adjusting signals Sad11, Sad12, Sad21, Sad22 for controlling the first cascoded transconducting circuit 1086a and the second cascoded transconducting circuit 1086b respectively. For example, if the loading value of the loading device 102 is larger than the predetermined loading value, then the voltage level of the second voltage signal Sd2 is higher than the voltage level of the first voltage signal Sd1, and the voltage level of the signal Sa11 is higher than the voltage level of the signal Sa12. Then, after the signals Sa11 and Sa12 of the first amplifying signal Sa1 are inputted to the intermediate amplifying circuit 1084b, the voltage level of the signal Sa22 becomes higher than the voltage level of the signal Sa21. In other words, the current flowing through the P type transistor Mp1 is larger than the current flowing through the P type transistor Mp3, and the current flowing through the P type transistor Mp2 is larger than the current flowing through the P type transistor Mp4. Therefore, the voltage level of the adjusting signal Sad11 is higher than the voltage level of the adjusting signal Sad21, and the voltage level of the adjusting signal Sad12 is higher than the voltage level of the adjusting signal Sad22.

When the adjusting signals Sad11, Sad12, Sad21, Sad22 are coupled to the gate terminals of the N type transistors Mn9, Mn10, Mn7, Mn8, the second adjusting current Iad2 generated by the second cascoded transconducting circuit 1086b is larger than the first adjusting current Iad1 generated by the first cascoded transconducting circuit 1086a. The operating current I1 flowing through the latching stage 106 becomes smaller. According to the above equation −Rn=−1/gm (wherein the value of the gm is directly proportional to the operating current of the cross-coupled pair M4, M5), when the operating current I1 flowing through the latching stage 106 becomes smaller, the value of Rn becomes larger. In other words, when the resistance Rp becomes larger, the resistance Rn becomes larger, and when the resistance Rp becomes smaller, the resistance Rn becomes smaller. For brevity, the adjusted resistance of the latching stage 106 seen from the output terminals No1, No2 is represented by Rnb. Through appropriate modifications made to the circuits, the adjusted output resistance of the output terminals No1, No2 can be calibrated to the original desired output resistance Rout (i.e. Rp+(−Rn)=Rpb+(−Rnb)). In addition, the other reference current source 112 in this embodiment is utilized to provide a fixed reference current (the reference current If) for the input stage 104. By doing this, the current generated by the reference current source 110 becomes smaller when the signal operating circuit 100 is operated under the normal operation since the reference current source 112 has provided part of the current of the total current required by the reference current source 110.

Figure 6:
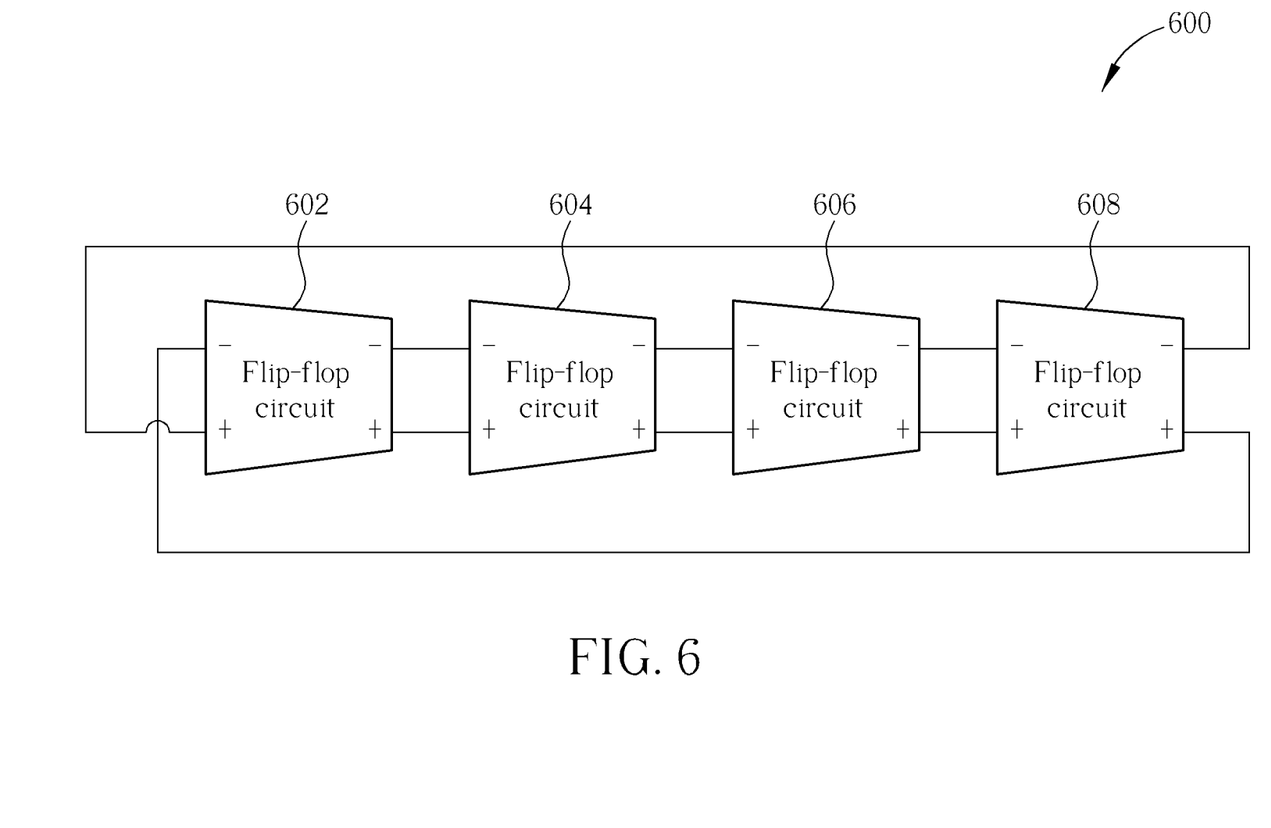
FIG. 6 is a diagram illustrating a ring oscillator by using a signal operating circuit according to an embodiment of the present invention.

Please note that the signal operating circuit 100 can also be implemented in a flip-flop circuit. FIG. 6 is a diagram illustrating a ring oscillator 600 using the signal operating circuit 100 according to an embodiment of the present invention. The ring oscillator 600 is a 4-stage ring oscillator, wherein each flip-flop circuit (i.e. 602, 604, 606, 608) is implemented by the present signal operating circuit 100. As mentioned in the above description of the signal operating circuit 100, when the output resistance of each flip-flop circuit is deviated due to the semiconductor manufacturing process, the output resistance of each flip-flop circuit can be compensated or calibrated to the original desired output resistance, so the delay time of each flip-flop can then be adjusted into a predetermined delay value. Accordingly, when the delay time of each flip-flop in the ring oscillator 600 is the predetermined value, the oscillating frequency Fosc of the clock signal generated by the ring oscillator 600 can be obtained by the following equation:

$$Fosc=(2*N*Td)^{-1},$$

wherein N is the number of flip-flop circuits in the ring oscillator 600, and Td is the predetermined delay time of each flip-flop circuit. By using the present signal operating circuit 100 to implement the ring oscillator 600, the oscillating frequency of the ring oscillator 600 can be controlled to not vary according to the semiconductor manufacturing process.

Figure 7A:
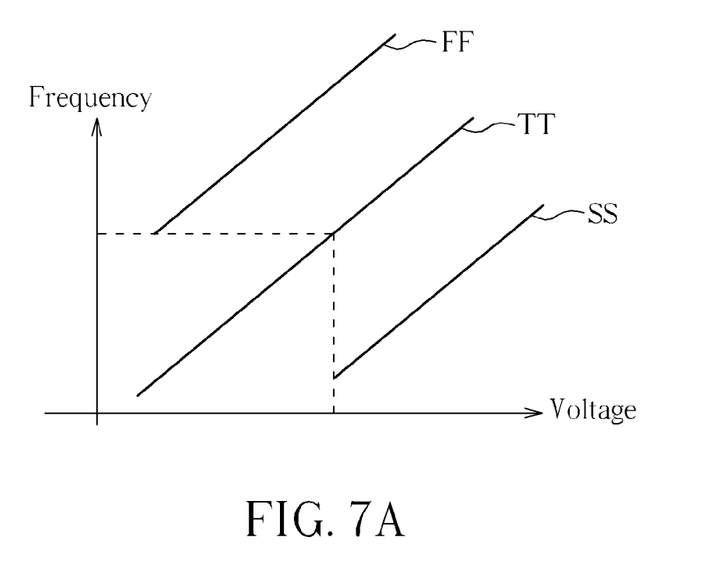
FIG. 7A is a diagram illustrating a plurality of characteristic curves of gains of a ring oscillator corresponding to different corners of a semiconductor manufacturing process before the present compensation.
Figure 7B:
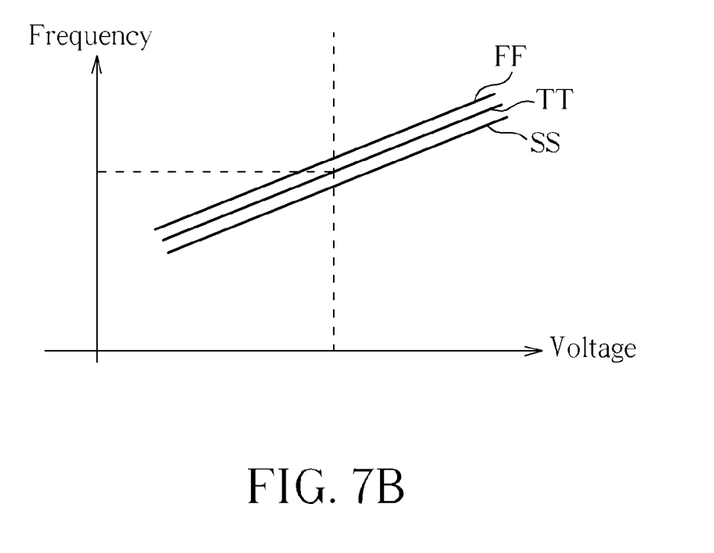
FIG. 7B is a diagram illustrating a plurality of characteristic curves of gains of a ring oscillator corresponding to the same corners of the semiconductor manufacturing process according to an embodiment of the present invention.

Please refer to FIG. 7A and FIG. 7B. FIG. 7A is a diagram illustrating a plurality of characteristic curves of the gain (Kvco) of a ring oscillator corresponding to different corners (FF, TT, SS) of a semiconductor manufacturing process before the present compensation. FIG. 7B is a diagram illustrating a plurality of characteristic curves of the gain of the present ring oscillator 600 corresponding to the same corners of the semiconductor manufacturing process according to an embodiment of the present invention. It can be seen that, under different corners of the semiconductor manufacturing process, the slopes of the characteristic curves and the gaps between the characteristic curves of the gain of the conventional ring oscillator corresponding to the corners FF, TT, SS are larger than the slopes of the characteristic curves and the gaps between the characteristic curves of the gain of the ring oscillator 600 corresponding to the corners FF, TT, SS respectively. Therefore, by using the ring oscillator 600 to implement a phase-locked loop, the jitter of the phase-locked loop can be smaller than its conventional counterpart. In other words, the loop filter in the phase-locked loop can be implemented by the capacitor having a smaller size than its conventional counterpart, and consequently reducing the cost of the phase-locked loop.

Briefly, according to the present invention, the deviated value of the semiconductor loading resistor of a flip-flop circuit is used to adjust the operating current of a latching stage in the flip-flop circuit for adjusting the transconducting gain of the latching stage to compensate the deviation of the loading resistor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A signal operating circuit, comprising:
    a loading device, having a loading value, wherein the loading value is deviated from a predetermined loading value by a loading deviation value;
    an input stage, coupled to the loading device, for converting an input signal into an output signal according to a controlling signal;
    a latching stage, coupled to the loading device and the input stage, for latching the output signal according to the controlling signal; and
    a controlling circuit, coupled to the latching stage, for at least adjusting an operating current of the latching stage to compensate the loading deviation value according to the loading deviation value of the loading device.

2. The signal operating circuit of the claim 1, wherein when the loading deviation value of the loading device is positive, the controlling circuit reduces the operating current of the latching stage.

3. The signal operating circuit of the claim 1, wherein when the loading deviation value of the loading device is negative, the controlling circuit increases the operating current of the latching stage.

4. The signal operating circuit of claim 1, wherein the controlling circuit comprises:
    a detecting circuit, arranged to generate a detecting signal corresponding to the loading deviation value; and
    an adjusting circuit, coupled to the detecting circuit, for adjusting the operating current flowing through the latching stage and an operating current flowing through the input stage according to the detecting signal.

5. The signal operating circuit of claim 4, wherein when the adjusting circuit increases one of the operating current flowing through the latching stage and the operating current flowing through the input stage, the adjusting circuit decreases the other of the operating current flowing through the latching stage and the operating current flowing through the input stage.

6. The signal operating circuit of claim 4, wherein the controlling circuit further comprises:
    a signal amplifying circuit, coupled to the detecting circuit and the adjusting circuit, for performing a signal amplifying operation upon the detecting signal to generate an adjusting signal;
    wherein the adjusting circuit uses the adjusting signal to adjust the operating current of the latching stage and the operating current of the input stage.

7. The signal operating circuit of claim 4, wherein the loading device is a loading resistor, the loading deviation value of the loading device is a resistance deviation value of the loading resistor, and the detecting circuit comprises:
    a first voltage signal generating circuit, arranged to output a first current to flow through a first resistor to generate a first voltage signal of the detecting signal; and
    a second voltage signal generating circuit, arranged to output a second current to flow through a second resistor to generate a second voltage signal of the detecting signal;
    wherein both the resistance deviation value of the first resistor and the resistance deviation value of the second resistor are similar to the resistance deviation value of the loading resistor, the first current corresponds to the resistance deviation value of the loading resistor, and the second current is a predetermined current.

8. The signal operating circuit of claim 7, wherein the first voltage signal generating circuit comprises:
    a transconducting circuit, arranged to generate a predetermined voltage upon a third resistor to generate a third current;
    a current mirror, coupled to the transconducting circuit, for generating the first current according to the third current; and
    the first resistor, coupled to the current mirror, for receiving the first current to generate the first voltage signal;
    wherein the resistance deviation value of the third resistor substantially equals the resistance deviation value of the loading resistor.

9. The signal operating circuit of claim 7, wherein the second voltage signal generating circuit comprises:
    a transconducting circuit, arranged to generate a predetermined voltage upon a reference resistor to generate a third current;

a current mirror, coupled to the transconducting circuit, for generating the second current according to the third current; and the second resistor, coupled to the current mirror, for receiving the second current to generate the second voltage signal;

wherein the reference resistor has a predetermined reference resistance.

10. The signal operating circuit of claim 6, wherein the signal amplifying circuit comprises:

an input-stage amplifying circuit, arranged to provide a first gain upon the detecting signal to generate a first amplifying signal, wherein a DC (Direct Current) bias voltage of the first amplifying signal is different from the DC bias voltage of the detecting signal;

an intermediate amplifying circuit, coupled to the input-stage amplifying circuit, for providing a second gain upon the first amplifying signal to generate a second amplifying signal, wherein the DC bias voltage of the second amplifying signal is different from the DC bias voltage of the first amplifying signal; and an output-stage amplifying circuit, coupled to the intermediate amplifying circuit, for providing a third gain upon the second amplifying signal to generate the adjusting signal.

11. The signal operating circuit of claim 4, wherein the adjusting circuit comprises:

a first cascoded transconducting circuit, coupled to the latching stage, for generating a first adjusting current to adjust the operating current flowing through the latching stage to generate a first adjusting current.

12. The signal operating circuit claim 11, wherein the adjusting circuit further comprises:

a second cascoded transconducting circuit, coupled to the input stage, for generating a second adjusting current to adjust the operating current flowing through the input stage according to the detecting signal.

* * * * *